United States Patent [19]
Takahashi et al.

[11] Patent Number: 5,818,077
[45] Date of Patent: Oct. 6, 1998

[54] FIELD EFFECT TRANSISTOR INCLUDING A PLURALITY OF ELECTRODE UNITS ARRANGED IN A ROW

[75] Inventors: Hidemasa Takahashi; Junko Morikawa; Fumiaki Katano, all of Tokyo, Japan

[73] Assignee: NEC Corporation, Tokyo, Japan

[21] Appl. No.: 621,602

[22] Filed: Mar. 26, 1996

[30] Foreign Application Priority Data

Mar. 31, 1995 [JP] Japan ..................................... 7-075111

[51] Int. Cl.$^6$ .......................... H01L 29/80; H01L 31/112
[52] U.S. Cl. ............................................. 257/276; 257/280
[58] Field of Search .................................. 257/341, 272, 257/276, 280, 283, 284, 287, 401

[56] References Cited

U.S. PATENT DOCUMENTS 5,283,452  2/1994  Shih et al. ............................. 257/276

FOREIGN PATENT DOCUMENTS

196965  4/1989  Japan ..................................... 257/280

*Primary Examiner*—Steven H. Loke
*Attorney, Agent, or Firm*—Whitham, Curtis & Whitham

[57] ABSTRACT

The field effect transistor includes (a) a plurality of drain finger electrodes, source finger electrodes and gate finger electrodes disposed in an active region on a semiconductor substrate so that each of the gate finger electrodes is sandwiched between each of the drain and source finger electrodes, (b) a source electrode pad for electrically connecting the source finger electrodes to each other, and (c) a gate electrode pad for electrically connecting the gate finger electrodes to each other, the gate electrode pad being disposed farther away from the active region than the source electrode pad. By disposing the gate electrode pad farther away from the active region than the source electrode pad, it is possible to arrange the source electrode pads at higher density, which is accompanied by a lesser number of source finger electrodes associated with each of the source electrode pads. Thus, it is possible to decrease source inductance, and avoid parasitic oscillation.

17 Claims, 9 Drawing Sheets

FIELD EFFECT TRANSISTOR INCLUDING A PLURALITY OF ELECTRODE UNITS ARRANGED IN A ROW

BACKGROUND OF THE INVENTION

1. Field of the Invention

The invention relates to a field effect transistor (FET), and more particularly to a structure of a high power field effect transistor.

2. Description of the Related Art

Hereinbelow is explained a conventional field effect transistor (FET) with reference to FIG. 1. In an active region 101 defined in a surface of a semiconductor substrate 100 are formed a plurality of unit FETs each comprising a drain finger electrode 31, a source finger electrode 41 and a gate finger electrode 51. These finger electrodes are arranged in repetitious fashion. Namely, the drain finger electrode 31 is always sandwiched between the source and gate finger electrodes 41 and 51, the source finger electrode 41 is always sandwiched between the drain and gate finger electrodes 31 and 51, and the gate finger electrode 51 is always sandwiched between the drain and source finger electrodes 31 and 41. The drain finger electrodes 31 are connected to each other through a drain bus bar 32, which is in turn connected to a drain electrode pad 33 to be connected to a bonding wiring (not illustrated).

The source finger electrodes 41 are connected to each other through a source bus bar 42 which is in turn connected to a source electrode pad 43. Thus, the drain finger electrodes 31 connected to each other through the drain bus bar 32 face to the source finger electrodes 41 connected to each other through the source bus bar 42 like a comb. The gate finger electrodes 51 are connected to a gate bus bar 52 which is in turn connected to a gate electrode pad 53 to be used for bonding. The gate bus bar 52 passes below the source finger electrodes 41. The source electrode pad 43 is electrically connected for grounding to a first metal layer (not illustrated) formed on a lower surface of the semiconductor substrate 100 through a second metal layer 62 filled in a via hole 61 formed passing through the semiconductor substrate 100.

In the conventional FET as mentioned above, the source finger electrodes 41 are grounded through many wirings. Hence, the conventional FET has source inductance great enough to oscillate in a millimeter wave band, namely a frequency band over 40 GHz.

A source finger electrode 41b disposed farthest away from the via hole 61 tends to have greater source inductance, and hence oscillate more than a source finger electrode 41a disposed closest to the via hole 61. Thus, unit FETs each of which comprises one of the drain finger electrodes 31, one of the source finger electrodes 41 and one of the gate finger electrodes 51 would have different source inductances and oscillation frequencies, resulting in that there exist various frequencies which may be oscillated. Accordingly, it is necessary to decrease source inductance and uniform source inductances of the unit FETs.

The via hole 61 is formed in order to decrease the source inductance. However, the conventional FET still has problems that each of the unit FETs has different source inductance from others in dependence on a distance between a source finger electrode and a source electrode pad, and that it is not possible to sufficiently decrease the source inductance in the source finger electrode 41b disposed farthest away from the via hole 61 among the source finger electrodes 41.

Figure 2:
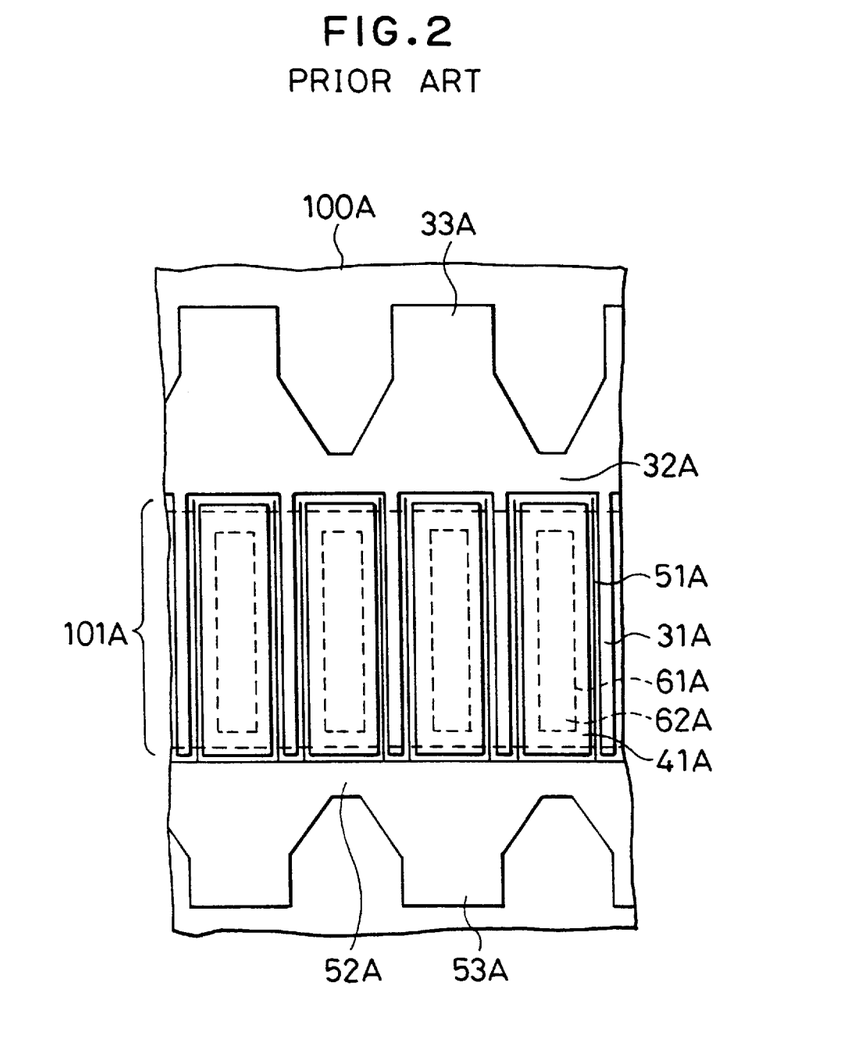
FIG. 2 is a plan view of the second conventional field effect transistor.

FIG. 2 illustrates a second conventional FET that has via holes 61A each of which is formed directly beneath each of source finger electrodes 41A in order to decrease source inductance. This conventional FET makes it possible to decrease source inductance for each of the unit FETs and provide smaller dispersion in phase.

Figure 1:
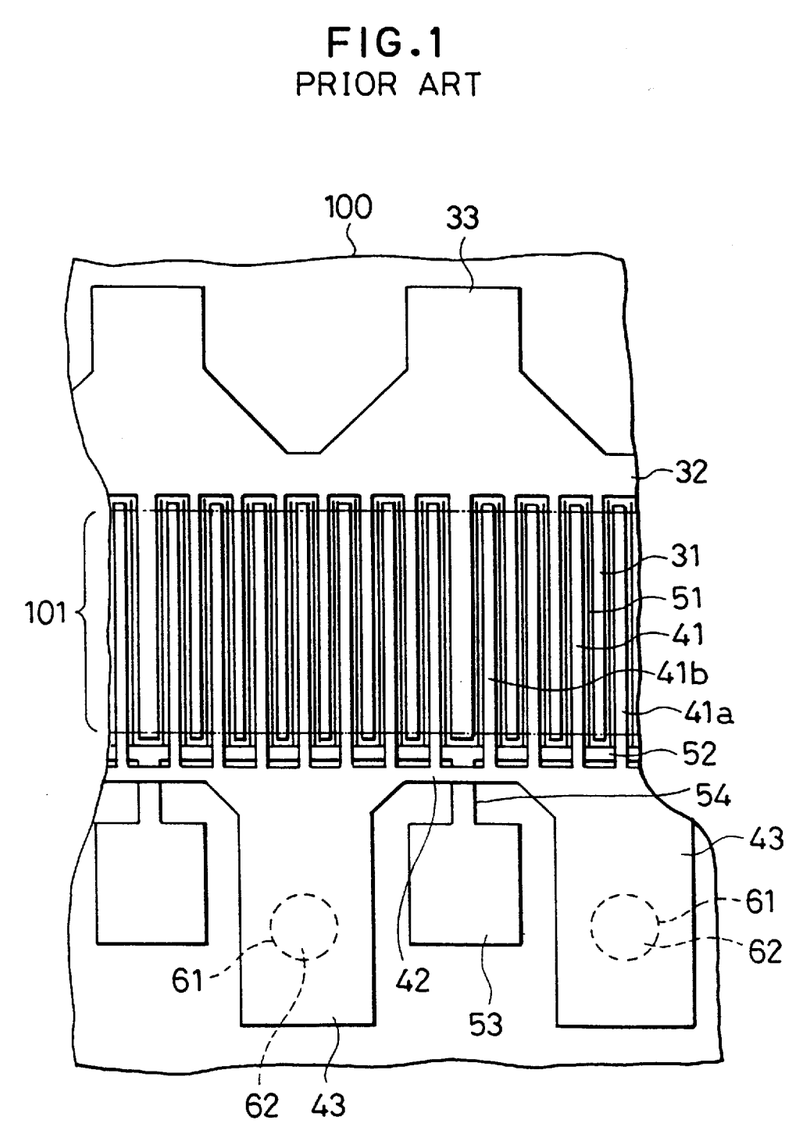
FIG. 1 is a plan view of the first conventional field effect transistor.

However, if a high power FET is to be accomplished in accordance with the structure of the conventional FET, each of the source finger electrodes 41A cannot avoid to have greater width than, for instance, the FET illustrated in FIG. 1 due to the via holes 61A formed in association with the source finger electrodes 41A, resulting in that it is not possible to built an FET having a great total gate width.

For instance, on the condition that the gate finger electrodes 51 are spaced away from adjacent ones by 15 $\mu$m, and each of the gate finger electrodes 51 has a length of 100 $\mu$m in the conventional FET illustrated in FIG. 1, it is required for a FET to have 200 gate finger electrodes for accomplishing a total gate width of 20 mm. A total width of the source, drain and gate finger electrodes is 3.0 mm. On the other hand, in the conventional FET illustrated in FIG. 2, each of the source finger electrodes 41A is required for accomplishing a total gate width of 20 mm to have a width of at least 30 $\mu$m because of the via holes 61A formed directly beneath the source finger electrodes 41A, resulting in that the gate finger electrodes 51 have to be spaced away from adjacent ones by about 40 $\mu$m. This makes a total width of the source, drain and gate finger electrodes to be 8.0 mm, which makes it impossible to build a high power FET due to possible problems such that an entire package of a semiconductor device cannot avoid to be larger in size, and that a chip tends to have curvature.

Though each of gate finger electrodes may have a greater length to thereby increase a total gate width, the length has to be extended to 270 $\mu$m for accomplishing a FET with a width thereof remaining not increased. If a gate finger electrode length is extended to 270 $\mu$m, the gate resistance increases up to 2.7 times greater than the first conventional FET, accompanied with a problem of lowered gain. Thus, the second conventional FET has a problem that it is difficult or impossible to build a high power FET having a great total gate width.

Figure 3:
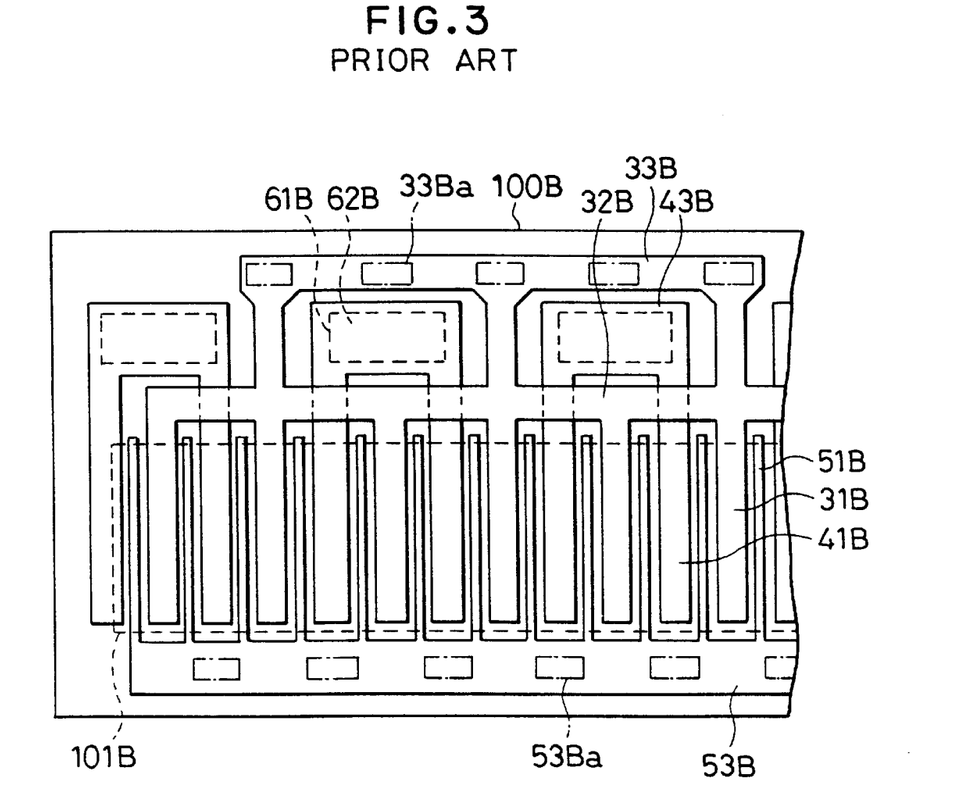
FIG. 3 is a plan view of the third conventional field effect transistor.

FIG. 3 illustrates a third conventional FET having been suggested in Japanese Unexamined Patent Publication No. 1-96965. In this conventional FET, drain and source finger electrodes 31B and 41B are disposed at the same side with respect to an active region 101B. The third conventional FET makes it possible to decrease both source inductance and phase dispersion to thereby prevent parasitic oscillation. However, the illustrated third conventional FET is accompanied with a problem that parasitic capacitance between source and drain cannot avoid to be greater and hence high frequency characteristic is deteriorated because the source finger electrodes 41B intersect with a drain bus bar 32B. In addition, the third conventional FET has greater drain inductance, and also has a greater difference in phase between output signals transmitted from each of unit FETs than an ordinary FET in which source and drain finger electrodes are disposed at opposite sides of an active region. Thus, the third conventional FET is not suitable for accomplishing high power.

As having been described, the first conventional FET has a problem of great and uneven source inductance accompanied by possible parasitic oscillation. The second conventional FET can provide decreased and uniform source inductance thereby to prevent occurrence of parasitic oscillation, building a high power FET having a great total gate width is problematic because the FET is sized beyond chip size limitation. The third conventional FET can accomplish decreased source inductance and enhanced uniformity of source inductance, but has a problem that the intersection of source finger electrode wirings with drain finger electrode wirings makes the parasitic capacitance greater to thereby deteriorate frequency characteristic. In addition, the third conventional FET has an increased drain inductance and great dispersion in phase, resulting in that the third conventional FET is not suitable for obtaining a high power FET.

SUMMARY OF THE INVENTION

In view of the above mentioned problems of the conventional field effect transistors, it is an object of the present invention to provide a field effect transistor which is capable of preventing parasitic oscillation without sacrificing frequency characteristic and output.

The present invention provides a field effect transistor including (a) a plurality of drain finger electrodes, source finger electrodes and gate finger electrodes disposed in an active region on a semiconductor substrate so that each of the gate finger electrodes is sandwiched between each of the drain and source finger electrodes, (b) a source electrode pad for electrically connecting the source finger electrodes to each other, and (c) a gate electrode pad for electrically connecting the gate finger electrodes to each other, the gate electrode pad being disposed farther away from the active region than the source electrode pad.

By disposing the gate electrode pad farther away from the active region than the source electrode pad, it is possible to arrange the source electrode pad at higher density, and hence decrease the number of the source finger electrodes associated with the source electrode pads. Thus, the source inductance is decreased, and thus it is possible to prevent parasitic oscillation from occurring.

The field effect transistor may further include: (d) a drain bus bar disposed outside the active region and electrically connecting the drain finger electrodes to each other; (e) a drain electrode pad electrically connected to the drain bus bar; (f) a gate bus bar disposed in facing relation with the drain bus bar across the active region and electrically connecting the gate finger electrodes to each other, the gate electrode pad being electrically connected to the gate bus bar, and the source electrode pad being disposed farther away from the active region than the gate bus bar; (g) a pair of conductors for electrically connecting the gate electrode pad to the gate bus bar, the conductors extending around the source electrode pad; (h) a first conductive layer formed on a lower surface of the semiconductor substrate; and (g) a second conductive layer filled in a via hole formed between the source electrode pad and the first conductive layer, the second conductive layer electrically connecting the source electrode pad to the first conductive layer.

There may be formed a plurality of via holes between the source electrode pad and the first conductive layer. Each of the via holes is filled with the second conductive layer. The gate electrode pad may be disposed for every source electrode pad or every two source electrode pads.

The present invention further provides a field effect transistor including (a) a plurality of drain finger electrodes, source finger electrodes and gate finger electrodes disposed in an active region on a semiconductor substrate so that each of the gate finger electrodes is sandwiched between each of the drain and source finger electrodes, and (b) a source electrode pad for electrically connecting the source finger electrodes to each other. In this field effect transistor, the active region is shaped in an arc so that each of the source finger electrodes is equally spaced away from a via hole formed below the source electrode pad.

By making uniform a distance between each of the source finger electrodes of each of unit FETs and a via hole associated with each of the source electrode pads, it is possible to uniform the source inductance for each of the unit FETs. Hence, the multiplicity in oscillation frequency of each of the finger electrodes can be lowered to thereby prevent occurrence of parasitic oscillation.

The above mentioned field effect transistor may further include (c) a drain electrode pad disposed outside the active region and electrically connecting the drain finger electrodes to each other, (d) a gate bus bar disposed in facing relation with the drain electrode pad across the active region and electrically connecting the gate finger electrodes to each other, and (e) a gate electrode pad electrically connected to the gate bus bar, the source electrode pad being disposed farther away from the active region than the gate bus bar, (f) a first conductive layer formed on a lower surface of the semiconductor substrate, (g) a second conductive layer filled in a via hole formed between the source electrode pad and the first conductive layer, the second conductive layer electrically connecting the source electrode pad to the first conductive layer, (h) a plurality of wirings for electrically connecting the source electrode pad to the source finger electrodes, the wirings having common width and length.

The active region may be shaped to a plurality of arcs continuously formed in periodical repeat, in which case a plurality of source electrode pads is provided in association with each of the arcs, and a source bus bar may be formed for electrically connecting the adjacent source electrode pads to each other. In addition, it is preferable that the via hole is shaped to be semi-circular.

The present invention still further provides a field effect transistor including (a) a plurality of drain finger electrodes, source finger electrodes and gate finger electrodes disposed in an active region on a semiconductor substrate so that each of the gate finger electrodes is sandwiched between each of the drain and source finger electrodes, and (b) a source electrode pad for electrically connecting the source finger electrodes to each other, a via hole being formed below the source electrode pad, each of the source finger electrodes being spaced away from the via hole by a distance so that an electrical length corresponding to the distance does not exceed $1/16$ of a wavelength at maximum oscillation frequency of a unit field effect transistor including one of the gate finger electrodes, one of the source finger electrodes and one of the drain finger electrodes.

The above mentioned field effect transistor controls a maximum line length between each of the source finger electrodes and the source electrode pad associated therewith to thereby improve unevenness of the source inductance. Specifically, by determining a distance between each of the source finger electrodes and the via hole so that the electrical length is below $1/16$ of a wavelength at maximum oscillation frequency of a unit FET, it is possible to prevent occurrence of parasitic oscillation.

The above mentioned field effect transistor may further include (a) a drain bus bar disposed outside the active region and electrically connecting the drain finger electrodes to each other, (b) a drain electrode pad electrically connected to the drain bus bar, (c) a gate bus bar disposed in facing relation with the drain bus bar across the active region and electrically connecting the gate finger electrodes to each other, (d) a gate electrode pad electrically connected to the gate bus bar, (e) a source bus bar disposed farther away from the active region than the gate bus bar for electrically connecting the adjacent source electrode pads to each other, the source electrode pad being electrically connected to the source bus bar, (f) a first conductive layer formed on a lower surface of the semiconductor substrate, and (g) a second conductive layer filled in the via hole formed between the source electrode pad and the first conductive layer, the second conductive layer electrically connecting the source electrode pad to the first conductive layer.

The present invention yet further provides a field effect transistor including (a) a plurality of drain finger electrodes disposed in an active region on a semiconductor substrate, (b) a plurality of source finger electrodes disposed in the active region, (c) a plurality of gate finger electrodes disposed in the active region, each of the gate finger electrodes being sandwiched between each of the drain and source finger electrodes, (d) a drain bus bar disposed outside the active region and electrically connecting the drain finger electrodes to each other, (e) a drain electrode pad electrically connected to the drain bus bar, (f) a gate bus bar disposed in facing relation with the drain bus bar across the active region and electrically connecting the gate finger electrodes to each other, (g) a gate electrode pad electrically connected to the gate bus bar, (h) a source electrode pad disposed farther away from the active region than the gate bus bar and electrically connecting the source finger electrodes to each other, (i) a first conductive layer formed on a lower surface of the semiconductor substrate, and (j) a second conductive layer filled in a plurality of via holes formed between the source electrode pad and the first conductive layer, the second conductive layer electrically connecting the source electrode pad to the first conductive layer.

The formation of a plurality of via holes below the source electrode pad makes it possible for the second conductive layer to have a greater total surface area than a single via hole, thereby it is possible to decrease the source inductance and prevent parasitic oscillation.

In addition, the above mentioned field effect transistors can decrease the source inductance without increasing a chip size and deteriorating the frequency characteristic when an attempt is made to obtain higher power by increasing the number of unit FETs.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Hereinbelow is explained a field effect transistor made in accordance with the first embodiment of the present invention with reference to FIGS. 4A and 4B. A semiconductor substrate 100C having a semi-insulating GaAs substrate 103C and an n-type GaAs crystal layer 104C formed on the semi-insulating GaAs substrate 103C has a rectangular active region 101C defined thereon by insulating regions or proton implantation regions 102C. On the active region 101C are formed a plurality of gate finger electrodes 51C each of which is made of a metal layer forming a schottky barrier, a plurality of source finger electrodes 41C each made of ohmic metal such as AuGe/Ni, and a plurality of drain finger electrodes 31C. For instance, each of the gate finger electrodes 51C is made of a titanium (Ti) bottom film, a platinum (Pt) intermediate film, and a gold (Au) top film. The drain finger electrodes 31C is always sandwiched between the source and gate finger electrodes 41C and 51C, the source finger electrodes 41C is always sandwiched between the drain and gate finger electrodes 31C and 51C, and the gate finger electrode 51C is always sandwiched between the drain and source finger electrodes 31C and 41C.

The gate finger electrodes 51C are connected to a gate bus bar 52C which is in turn connected to a gate electrode pad 53C through a pair of conductors 54C. The pair of conductors 54C extending at the opposite sides of a source electrode pad 43C provide dual signal paths connecting the gate electrode pad 53C to the gate bus bar 52C to thereby decrease a difference in input signals in phase among the gate finger electrodes 51C. The source finger electrodes 41C are connected to the source electrode pad 43C which is electrically connected for grounding to a first conductive layer 70C formed on a lower surface of the GaAs substrate 103C through a second conductive layer 62C filled in a via hole 61C formed through the GaAs substrate 103C and the n-type GaAs crystal layer 104. For instance, the GaAs substrate 103C has a thickness of about 35 μm, and the via hole 61C has a diameter of 40 μm. The drain finger electrodes 31C are connected to a drain bus bar 32C which is in electrical connection and physically continuous with a drain electrode pad 33C.

The first embodiment is characterized by disposing the gate electrode pad 53C farther away from the active region 101C than the source electrode pad 43C to thereby make it possible to form source electrode pads in greater number unlike the first conventional FET. In addition, it is no longer necessary to form a source bus bar (see the reference number 42 in FIG. 1) for connecting adjacent source electrode pads to each other, because the source electrode pad 43C acts also as a source bus bar. Accordingly, it is possible to decrease the source inductance for each of the unit FETs and improve unevenness thereof, resulting in that parasitic oscillation can be prevented. It should be noted that impedance of gate electrodes is somewhat increased, but it does not matter because there runs almost no current runs through the gate electrodes.

A field effect transistor having a source bus bar in place of a source electrode pad in a region surrounded by the gate electrode pad 53C, conductors 54C and gate bus bar 52C, namely almost the same FET as the first conventional one, has source inductance of about 35 pH, whereas the FET in accordance with the first embodiment can decrease the source inductance down to 5 pH. In addition, a FET made in accordance with the first embodiment increase does not increase chip width for accomplishing a high power FET unlike the second conventional FET.

Figure 5:
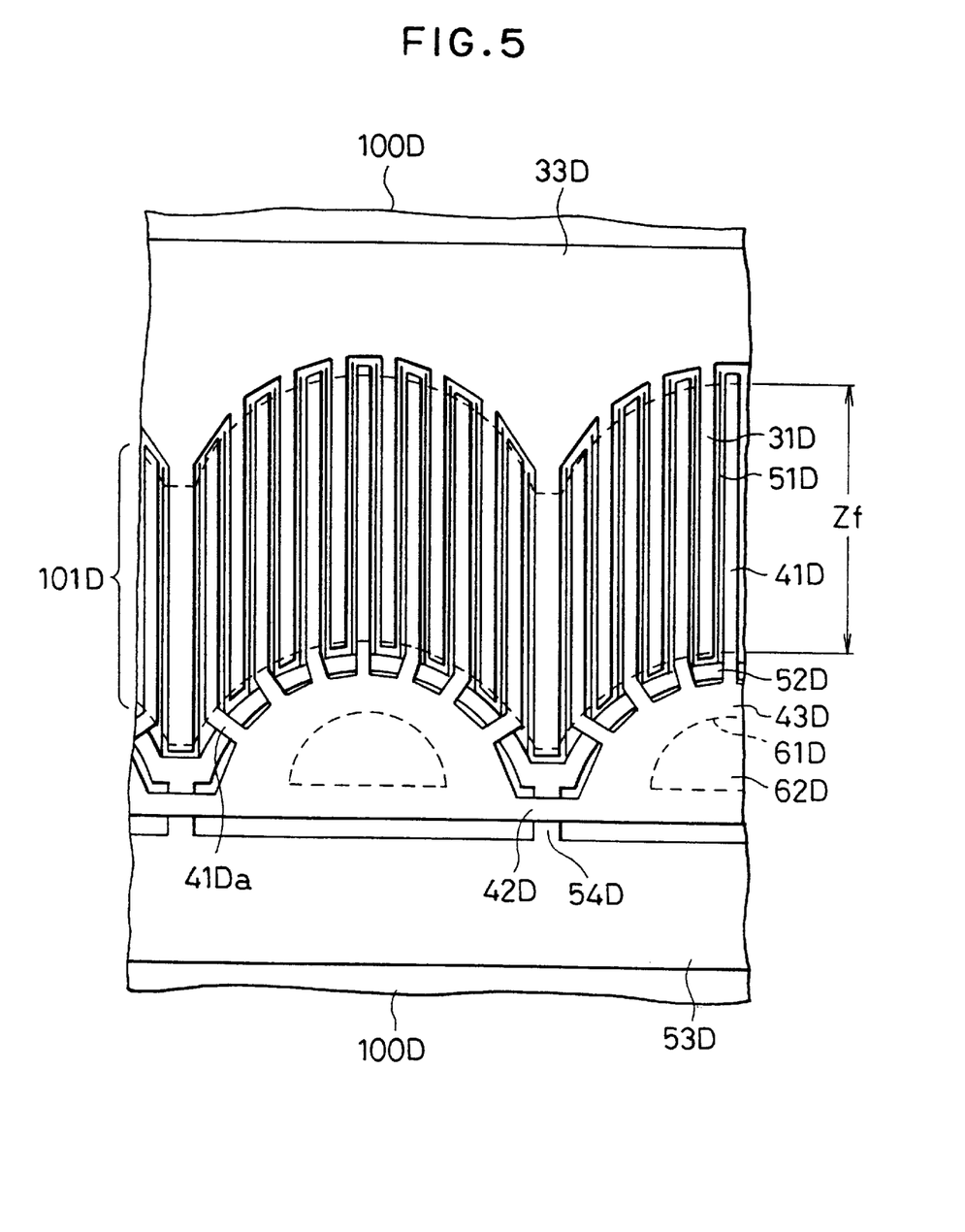
FIG. 5 is a plan view of a field effect transistor fabricated in accordance with the second embodiment of the present invention.

FIG. 5 illustrates a field effect transistor to be made in accordance with the second embodiment of the present invention. An active region 101D having repetitious arrangement of drain, source and gate finger electrodes 31D, 41D and 51D is not rectangular in shape unlike the first embodiment, but includes a plurality of semi-circular arcs projecting towards a drain electrode pad 33D. Specifically, the active region 101D is shaped into a plurality of arcs continuously formed in periodically repetitious fashion. The arcuate active region 101D projecting towards the drain electrode pad 33D uniformizes finger length Zf of the gate finger electrodes 51D of each of the unit FETs.

Below the source electrode pad 43D is formed a via hole 61D filled with a second conductive layer 62D through which the source electrode pad 43D is electrically connected to a first conductive layer (not illustrated) formed on a lower surface of a semiconductor substrate 100D. The source finger electrodes 41D are connected to the source electrode pad 43D through wirings 41Da having common width and length.

Thus, each of the source finger electrodes 41D can have uniform source inductance, and in addition it is possible to shorten a distance between each of the source finger electrodes 41D and the via hole 61D in comparison with an ordinary FET such as the first conventional FET.

It is considered that each of the source finger electrodes 41D is directly connected to the source electrode pad 43D not through a source bus bar, and hence, it is possible to decrease the source inductance of 30 pH in the source bus bar 42 in the first conventional FET down to the source inductance of 5 pH in the via hole 61D.

The second embodiment provides an additional advantage relative to the first embodiment that the source finger electrodes 41D have uniform source inductance by equalizing a distance between each of the source finger electrodes 41D to the via hole 61D. In the first conventional FET, the distances between each of the unit FETs and the via hole 61 are different from others, and hence the maximum source inductance is greater than the minimum source inductance by 30 pH or greater. Such a difference in source inductance causes oscillation frequency to be varied in the unit FETs, resulting in a variety of oscillation frequencies. Thus, parasitic oscillation tends to occur. The second embodiment decreases and uniformizes the source inductance in each of the unit FETs to thereby prevent occurrence of parasitic oscillation.

In addition, a FET made in accordance with the second embodiment causes no increase in a chip width for accomplishing a high power FET having a great total gate width unlike the second conventional FET.

The wirings 41Da intersect the gate bus bar 52D so that the gate bus bar 52D passes below the wirings 41Da with an air-bridge formed therebetween. The gate electrode pad 53D is electrically connected to the gate bus bar 52D through conductors 54D passing below the source bus bar 42D. The drain electrode pad 33D is in direct connection with the drain finger electrodes 31D. The gate electrode pad 53D and the drain electrode pad 33D are electrically connected to external matching circuits (not illustrated) through gold wirings (not illustrated).

Figure 6:
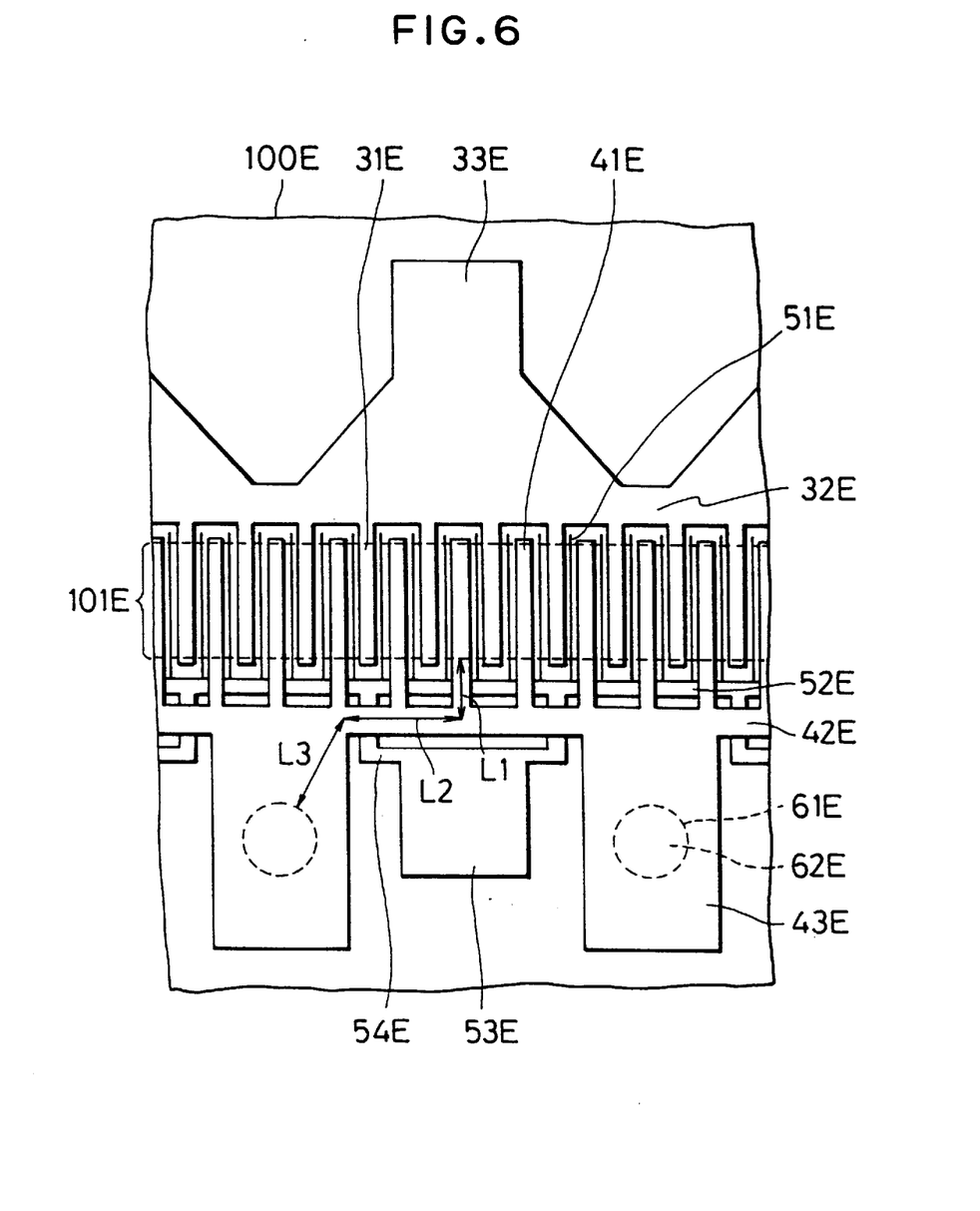
FIG. 6 is a plan view of a field effect transistor fabricated in accordance with the third embodiment of the present invention.

FIG. 6 illustrates a field effect transistor made in accordance with the third embodiment of the present invention. The third embodiment is characterized by a limited total electrical length comprising a length L1 of each of source finger electrodes 41E within an insulating region, a length L2 of a source bus bar 42E ranging from the source finger electrode 41E to a source electrode pad 43E, and a length L3 ranging from the source electrode pad 43E to a via hole 61E.

In general, parasitic oscillation is likely to be made for a unit FET having greater high frequency gain. It is possible to prevent parasitic oscillation from occurring by determining a length L (L=L1+L2+L3) so that an electrical length for the length L is $\frac{1}{16}$ or smaller of a wavelength $\lambda$ at maximum oscillation frequency $f_{max}$ of a unit FET.

Figure 7:
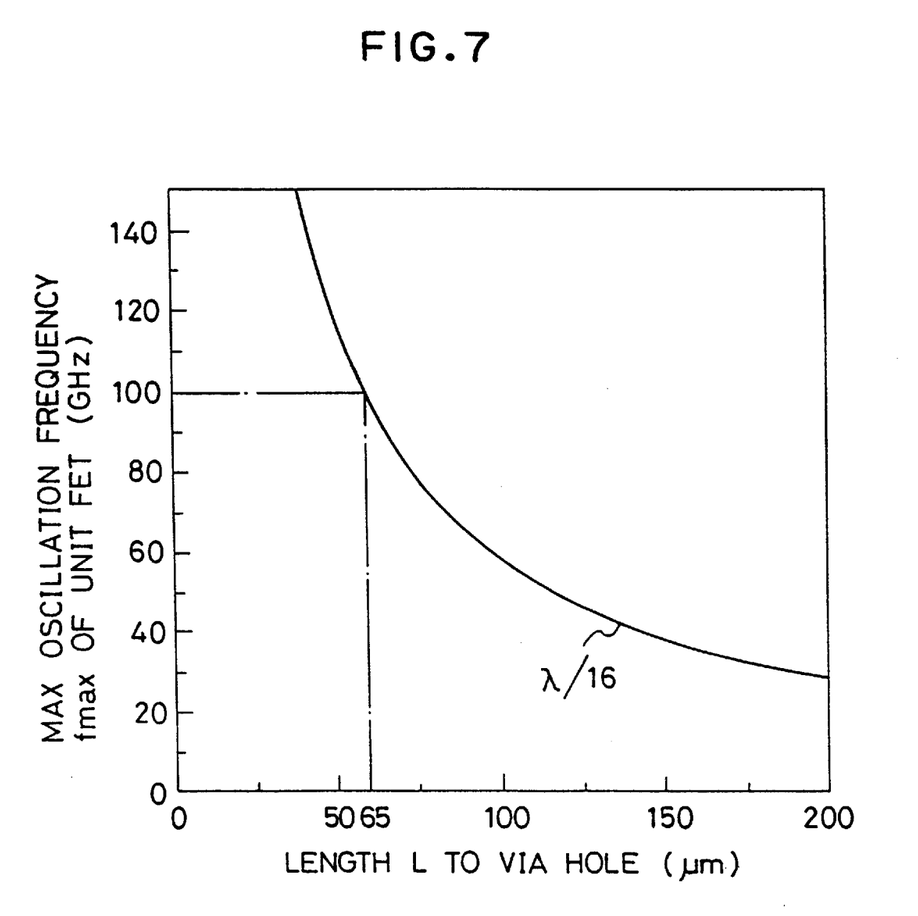
FIG. 7 is a graph showing the relationship between maximum oscillation frequency $f_{max}$ of a unit FET and a distance L from a unit FET to a via hole in the field effect transistor illustrated in FIG. 6.

FIG. 7 shows the relationship between the maximum oscillation frequency $f_{max}$ and the length L at which oscillation is commenced. An illustrated curve denotes $\frac{1}{16}$ of a wavelength $\lambda$ of signals transmitted through a strip line for the maximum oscillation frequency $f_{max}$. In view of the illustrated curve, it is understood that the parasitic oscillation does not occur, if the length L is equal to or smaller than $\lambda/16$ on the assumption that an n-type GaAs layer, which is an active layer, has a thickness of 300 nm, a recessed portion of the n-type GaAs layer has a thickness of 150 nm, a distance between the gate finger electrode and the recessed portion is 0.5 $\mu$m, and a distance between the gate finger electrode and the source finger electrode is 0.5 $\mu$m.

Figure 8:
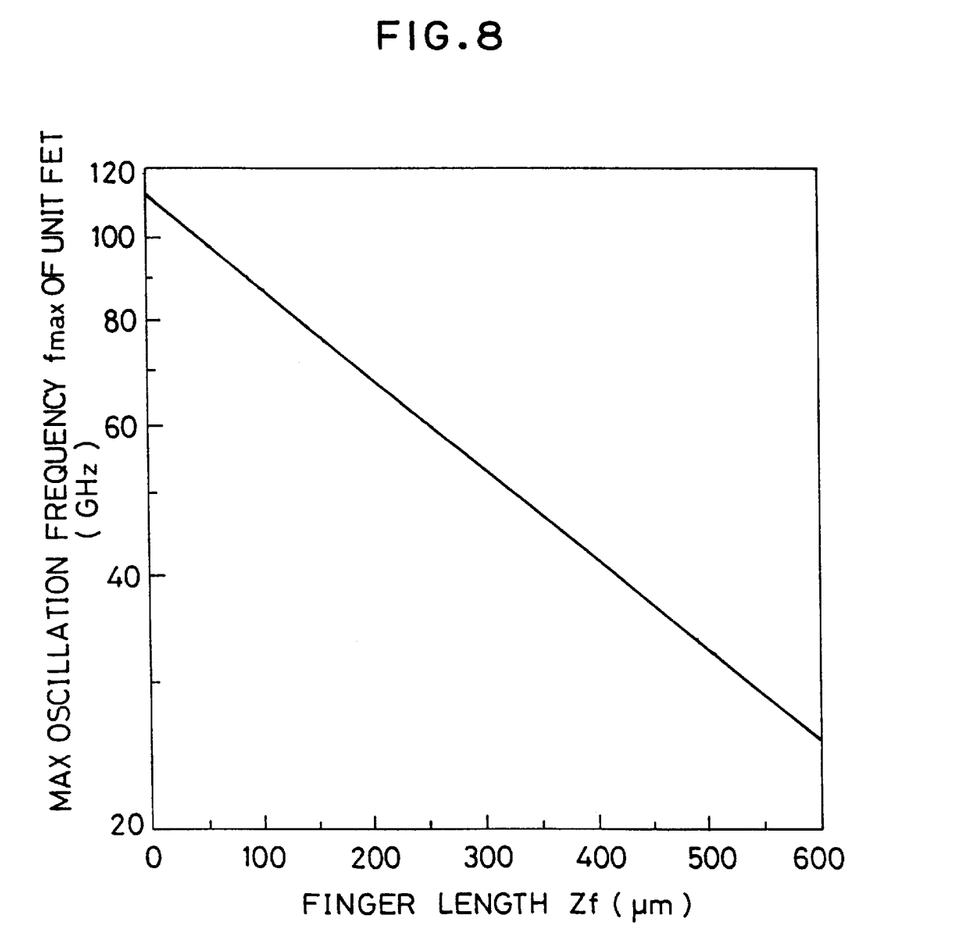
FIG. 8 is a graph showing the relationship between maximum oscillation frequency $f_{max}$ of a unit FET and a finger length Zf in the field effect transistor illustrated in FIG. 6.

FIG. 8 shows the dependency of maximum oscillation frequency $f_{max}$ of a unit FET in GaAs MESFET having a gate length of 0.5 $\mu$m on finger length Zf. In the third embodiment, the gate finger length Zf is 100 $\mu$m, and the maximum oscillation frequency $f_{max}$ is 90 GHz. On the assumption that a dielectric constant of the GaAs substrate is 13, an electrical length or line length for one wavelength of a strip line on the GaAs substrate is about 104 $\mu$m at 100 GHz. Accordingly, as is obvious in view of FIG. 7, by setting the length L ranging from a via hole to a source finger electrode disposed farthest away from the via hole to be 65 $\mu$m or smaller, it is possible to build a FET without parasitic oscillation. Herein, the reason why 100 GHz which is greater than the maximum oscillation frequency $f_{max}$ of a unit FET is selected is to allow for 10 GHz as a margin.

Figure 4A:
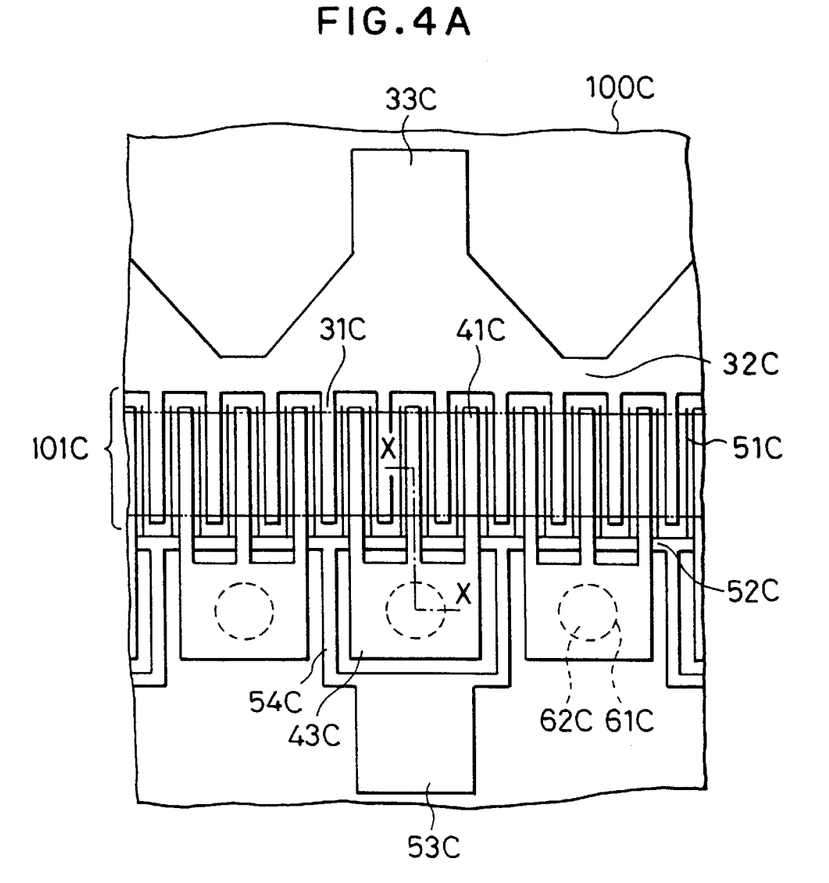
FIG. 4A is a plan view of a field effect transistor fabricated in accordance with the first embodiment of the present invention.
Figure 4B:
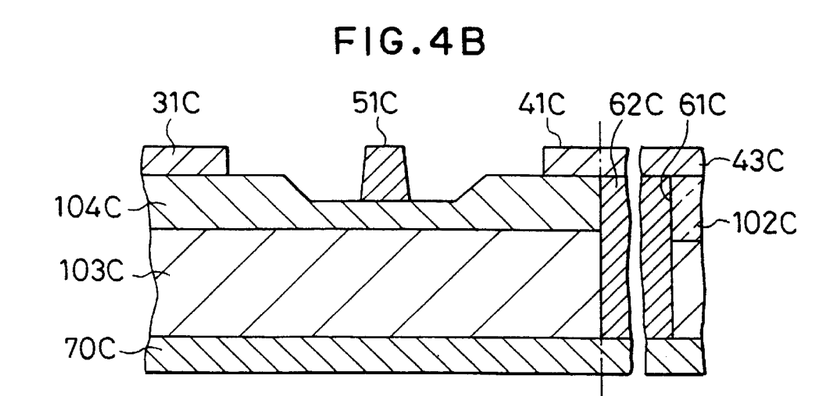
FIG. 4B is a cross-sectional view taken along the line X—X of FIG. 4A.

The third embodiment can be applied to planar-patterned FETs such as the first conventional FET illustrated in FIG. 1 and the first embodiment illustrated in FIGS. 4A and 4B.

Figure 9:
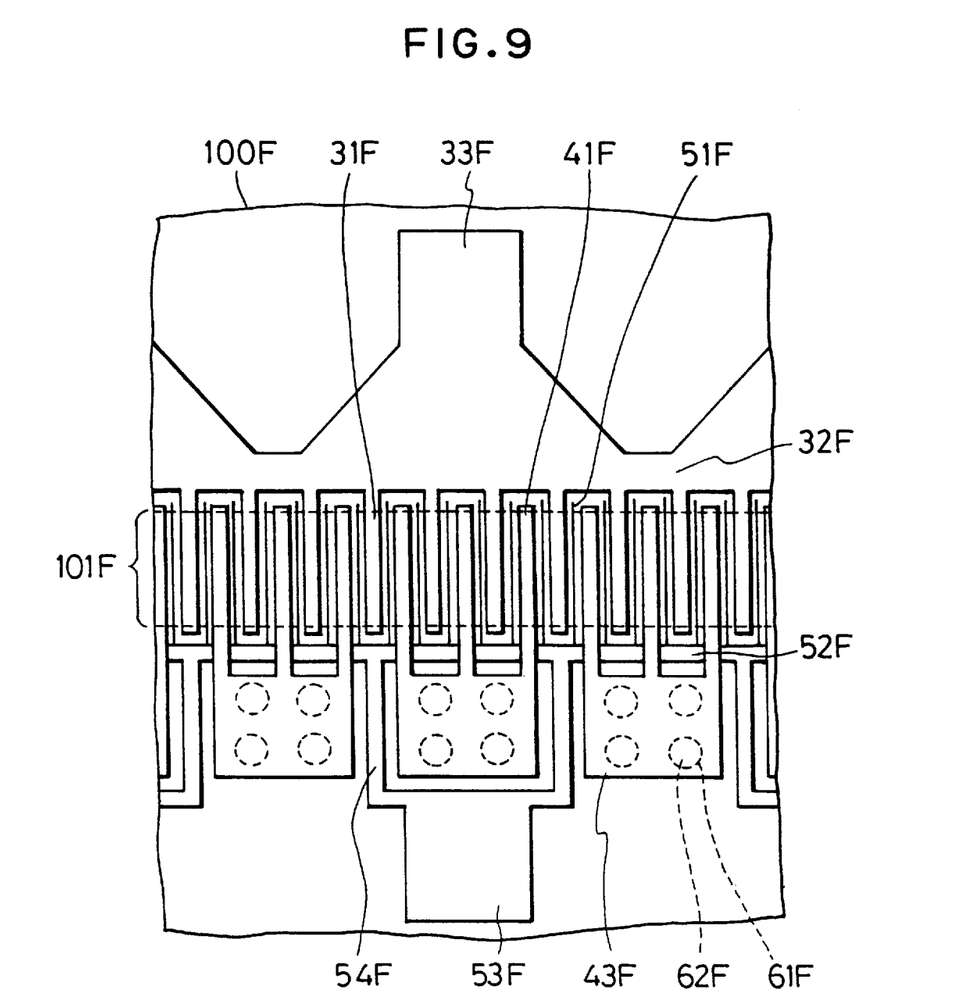
FIG. 9 illustrates a field effect transistor fabricated according to a fourth embodiment of the present invention.

FIG. 9 illustrates a field effect transistor made in accordance with the fourth embodiment of the present invention. The fourth embodiment has the same structure as the first embodiment except that four via holes 61F are formed for each of source electrode pads 43F. The first embodiment can prevent parasitic oscillation by decreasing the inductance of the source electrode pad 43C, whereas the fourth embodiment decreases the source inductance residual in the via holes 61F. In the first embodiment, the via hole 61C has a diameter of 40 μm, and the source inductance is 5 pH. In accordance with the fourth embodiment, it is possible to decrease the source inductance down to 2.5 pH or smaller to thereby prevent parasitic oscillation by providing the four, 25 μm-diameter via holes 61F per a source electrode pad. This is because four smaller via holes can provide a greater total surface area of a second conductive layer 62F with which the via holes are to be filled than a single larger via hole. It should be noted that the number of the via holes 61F is not to be limited to four, but may be any integer greater than one.

The fourth embodiment can be applied not only to a planar-patterned FET such as the first embodiment, but also to patterns such as the second and third embodiments in which the length L is not to be limited, and further to patterns of the first and second conventional FETs.

Although the above mentioned embodiments have been described in connection with GaAs MESFET, compound semiconductors such as InP may be used in place of GaAs. The present invention is suitable for a semiconductor device utilizing a via hole or via holes for decreasing source inductance. For instance, the present invention can be applied to a hetero-junction field effect transistor utilizing two-dimensional electron gas to be produced at an interface between an AlGaAs crystal layer and a GaAs crystal layer.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A field effect transistor comprising:
   (a) a plurality of drain finger electrodes, source finger electrodes and gate finger electrodes disposed in an active region on a semiconductor substrate so that each of said gate finger electrodes is sandwiched between each of said corresponding drain and source finger electrodes; and
   (b) a source electrode pad for electrically connecting said source finger electrodes to each other,
   said active region being shaped in an arc so that each of said source finger electrodes is equally spaced away from a via hole formed below said source electrode pad.

2. The field effect transistor as set forth in claim 1, further comprising:
   a drain electrode pad disposed outside said active region and electrically connecting said drain finger electrodes to each other.

3. The field effect transistor as set forth in claim 2, further comprising:
   a gate bus bar disposed in facing relation with said drain electrode pad across said active region and electrically connecting said gate finger electrodes to each other; and
   a gate electrode pad electrically connected to said gate bus bar,
   said source electrode pad being disposed farther away from said active region than said gate bus bar.

4. The field effect transistor as set forth in claim 3, further comprising:
   a first conductive layer formed on a lower surface of said semiconductor substrate; and
   a second conductive layer filled in said via hole formed between said source electrode pad and said first conductive layer, said second conductive layer electrically connecting said source electrode pad to said first conductive layer.

5. The field effect transistor as set forth in claim 4, wherein a plurality of via holes are formed between said source electrode pad and said first conductive layer, each of said via holes being filled with a respective second conductive layer.

6. The field effect transistor as set forth in claim 1, wherein said active region being shaped to a plurality of arcs continuously formed in periodic repetition, a plurality of source electrode pads each being provided in association with one of said arcs.

7. The field effect transistor as set forth in claim 6, further comprising a source bus bar for electrically connecting the adjacent source electrode pads to each other.

8. The field effect transistor as set forth in claim 7, further comprising a conductor for electrically connecting said gate electrode pad to said gate bus bar, said conductor passing below said source bus bar.

9. The field effect transistor as set forth in claim 1, further comprising a plurality of wirings for electrically connecting said source electrode pad to said source finger electrodes, said wirings having common width and length.

10. The field effect transistor as set forth in claim 9, wherein said wirings intersect said gate bus bar so that said gate bus bar passes below said wirings with an air-bridge formed between each of said wirings and said gate bus bar.

11. The field effect transistor as set forth in claim 9, wherein said via hole is semi-circular in shape.

12. A field effect transistor comprising:
    (a) a plurality of drain finger electrodes, source finger electrodes and gate finger electrodes disposed in an active region on a semiconductor substrate so that each of said gate finger electrodes is sandwiched between each of said corresponding drain and source finger electrodes; and
    (b) a source electrode pad for electrically connecting said source finger electrodes to each other, a via hole being formed below said source electrode pad,
    a portion of each of said source finger electrodes being spaced away from said via hole by a distance so that an electrical length corresponding to said distance does not exceed $\frac{1}{16}$ of a wavelength at maximum oscillation frequency of a unit field effect transistor including one of said gate finger electrodes, one of said source finger electrodes and one of said drain finger electrodes.

13. The field effect transistor as set forth in claim 12, further comprising:
    a drain bus bar disposed outside said active region and electrically connecting said drain finger electrodes to each other; and
    a drain electrode pad electrically connected to said drain bus bar.

14. The field effect transistor as set forth in claim 13, further comprising:
    a gate bus bar disposed in facing relation with said drain bus bar across said active region and electrically connecting said gate finger electrodes to each other; and
    a gate electrode pad electrically connected to said gate bus bar.

15. The field effect transistor as set forth in claim 14, further comprising:
    a source bus bar disposed farther away from said active region than said gate bus bar for electrically connecting said source electrode pad with an adjacent source electrode pad, said source electrode pad being electrically connected to said source bus bar.

16. The field effect transistor as set forth in claim 15, further comprising:

a first conductive layer formed on a lower surface of said semiconductor substrate; and a second conductive layer filled in said via hole formed between said source electrode pad and said first conductive layer, said second conductive layer electrically connecting said source electrode pad to said first conductive layer.

17. The field effect transistor as set forth in claim 16, wherein a plurality of via holes are formed between said source electrode pad and said first conductive layer, each of said via holes being filled with a respective second conductive layer.

* * * * *